United States Patent
Cao et al.

(10) Patent No.: US 10,011,437 B2
(45) Date of Patent: Jul. 3, 2018

(54) OVERTURNING AND SHIFTING MECHANISM

(71) Applicants: BOE TECHNOLOGY GROUP CO., LTD., Beijing (CN); BOE OPTICAL SCIENCE AND TECHNOLOGY CO., LTD., Suzhou, Jiangsu (CN)

(72) Inventors: Chunlei Cao, Beijing (CN); Ying Zang, Beijing (CN); Yuqi Mei, Beijing (CN); Wei Sun, Beijing (CN)

(73) Assignees: BOE TECHNOLOGY GROUP CO., LTD., Beijing (CN); BOE OPTICAL SCIENCE AND TECHNOLOGY CO., LTD., Suzhou, Jiangsu (CN)

( * ) Notice: Subject to any disclaimer, the term of this patent is extended or adjusted under 35 U.S.C. 154(b) by 38 days.

(21) Appl. No.: 14/906,126

(22) PCT Filed: Jul. 22, 2015

(86) PCT No.: PCT/CN2015/084766
§ 371 (c)(1),
(2) Date: Jan. 19, 2016

(87) PCT Pub. No.: WO2016/112673
PCT Pub. Date: Jul. 21, 2016

(65) Prior Publication Data
US 2016/0325942 A1    Nov. 10, 2016

(30) Foreign Application Priority Data
Jan. 16, 2015    (CN) .......................... 2015 1 0024325

(51) Int. Cl.
*B65G 49/05*    (2006.01)
*B65G 49/06*    (2006.01)
(Continued)

(52) U.S. Cl.
CPC ......... *B65G 47/248* (2013.01); *B65G 49/061* (2013.01); *B65G 49/064* (2013.01);
(Continued)

(58) Field of Classification Search
CPC .............................. B21B 39/32; B65G 49/067
See application file for complete search history.

(56) References Cited

U.S. PATENT DOCUMENTS 1,506,047 A * 8/1924 Bryan ..................... B21B 39/32
                                                          198/403
1,970,749 A * 8/1934 Heichert .............. B65G 49/067
                                                          198/404
(Continued)

FOREIGN PATENT DOCUMENTS

CN    201116957 Y    9/2008
CN    202144390 U    2/2012
(Continued)

OTHER PUBLICATIONS

Third Chinese Office Action dated Dec. 1, 2016; Appln. No. 201510024325.8.
(Continued)

*Primary Examiner* — Gregory W Adams
(74) *Attorney, Agent, or Firm* — Ladas & Parry LLP

(57) ABSTRACT

An overturning and shifting mechanism, comprising: a carrier platform (10) on which a first item-sensing device (12) is disposed; a transporting device (11) on which a second item-sensing device (13) is disposed; an overturning device (14) which is positioned between the carrier platform (10) and the transporting device (11) and which comprises a driving device (141) and a rotating arm (142), the rotating arm (142) being provided with a suction structure (15) thereon; and a control device which is connected with the first item-sensing device (12), the second item-sensing
(Continued)

device (13), the driving device (141) and the suction structure (15), wherein according to sensing signals of the first item-sensing device (12) and the second item-sensing device (13), the control device controls the driving device to drive the rotating arm (142) to rotate reciprocatingly between the carrier platform (10) and the transporting device (11), while at the same time the control device controls sucking or releasing operation of the suction structure (15). The mechanism is mainly used in production process of display devices and solves problems in contaminations and deformations due to overturning and shifting of display panels by manual operations in the conventional arts.

14 Claims, 3 Drawing Sheets

(51) Int. Cl.
| | |
|---|---|
| B23Q 7/16 | (2006.01) |
| B65G 47/248 | (2006.01) |
| H01L 21/67 | (2006.01) |
| H01L 21/677 | (2006.01) |
| H01L 21/683 | (2006.01) |

(52) U.S. Cl.
CPC ...... *B65G 49/067* (2013.01); *H01L 21/67259* (2013.01); *H01L 21/67736* (2013.01); *H01L 21/67766* (2013.01); *H01L 21/6838* (2013.01); *B65G 2249/02* (2013.01); *B65G 2249/04* (2013.01)

(56) References Cited

U.S. PATENT DOCUMENTS

| | | | | | |
|---|---|---|---|---|---|
| 2,022,242 | A | * | 11/1935 | Kristof | B65G 49/067 198/403 |
| 2,829,759 | A | * | 4/1958 | Parker | B65G 47/252 198/403 |
| 2,976,828 | A | * | 3/1961 | Kalning | B68G 15/005 112/2.1 |
| 3,080,984 | A | * | 3/1963 | Carlsen | B65G 47/24 100/15 |
| 3,235,057 | A | * | 2/1966 | Rea | B23Q 7/04 198/403 |
| 3,302,768 | A | * | 2/1967 | Copper | B21D 43/20 198/376 |
| 3,314,554 | A | * | 4/1967 | Cuniberti | C03B 35/12 198/403 |
| 3,322,256 | A | * | 5/1967 | Roach | B65G 47/24 198/406 |
| 3,485,387 | A | * | 12/1969 | Schmidt | B65G 57/081 414/773 |
| 3,529,710 | A | * | 9/1970 | Fiegel, Jr. | B65G 47/24 198/379 |
| 3,812,982 | A | * | 5/1974 | Crandlemire | B65G 65/00 414/771 |
| 3,876,489 | A | * | 4/1975 | Chenel | C03B 23/245 118/324 |
| 4,119,211 | A | * | 10/1978 | Boyer | H01L 21/67144 198/403 |
| 4,141,457 | A | * | 2/1979 | Nocek | G03F 7/2014 198/403 |
| 4,160,507 | A | * | 7/1979 | Mullins | B65G 47/904 198/374 |
| 4,214,655 | A | * | 7/1980 | Bernham | B65G 47/252 198/374 |
| 4,533,291 | A | * | 8/1985 | Nishida | B21D 43/105 100/207 |
| 5,259,495 | A | * | 11/1993 | Douglas | H05K 13/0061 198/404 |
| 5,515,796 | A | * | 5/1996 | Ogle | D05B 11/005 112/2.1 |
| 5,649,617 | A | * | 7/1997 | Fortenbery | B65G 47/263 198/781.03 |
| 6,695,572 | B2 | * | 2/2004 | Antonell | H01L 21/6732 414/810 |
| 8,328,255 | B2 | * | 12/2012 | Franz | B65G 49/068 294/65 |
| 2004/0197179 | A1 | * | 10/2004 | Achkire | H01L 21/6704 414/618 |
| 2004/0240981 | A1 | * | 12/2004 | Dothan | B65G 49/067 414/795.4 |
| 2014/0081443 | A1 | * | 3/2014 | Bando | B65G 49/067 700/112 |

FOREIGN PATENT DOCUMENTS

| | | |
|---|---|---|
| CN | 203127717 U | 8/2013 |
| CN | 103303662 A | 9/2013 |
| CN | 203212009 U | 9/2013 |
| CN | 203392488 U | 1/2014 |
| CN | 103567993 A | 2/2014 |
| CN | 104528385 A | 4/2015 |
| JP | 2009-043846 A | 2/2009 |
| KR | 100936992 B1 | 1/2010 |
| WO | WO 2012137453 A1 * 10/2012 ........... B65G 49/067 |

OTHER PUBLICATIONS

International Search Report and Written Opinion both dated Sep. 25, 2015; PCT/CN2015/084766.
First Chinese Office Action dated Dec. 29, 2015; Appln. No. 201510024325.8.

* cited by examiner

# OVERTURNING AND SHIFTING MECHANISM

TECHNICAL FIELD

Embodiments of the present invention relate to an overturning and shifting mechanism.

BACKGROUND

With the development of backlight products, such as ultrathin design of display devices, automatic assembling of non-final products and final products has been achieved gradually. The assembling of final products is performed based on processing of non-final products and thus an object of saving processes and the like is attained.

The assembling of a display panel in a typical display device is exemplified. A non-final product is manufactured by back-assembling a light guiding plate (the light guiding plate facing upward, the display face facing downward), and then assembling of films and the like by front-assembling the light guiding plate (the light guiding plate facing downward, the display face facing upward) is required. Therefore, in this process, the non-final product needs to be overturned and shifted. Typically, the non-final product are overturned and shifted manually by an operator and then the assembling operation is continued.

However, in the conventional technology, the operator is in direct contact with the display panel when the display panel is manually overturned and shifted, as a result of which the display panel is prone to be contaminated and failures such as deformation of the display panel due to ununiform distribution of stress occur.

SUMMARY

At least one embodiment of the present disclosure provides an overturning and shifting mechanism which solves problems in the conventional technology, such as contamination of the display panel due to manual overturning and shifting of the display panel and deformation of the display panel due to ununiform distribution of stress.

At least one embodiment of the present disclosure provides an overturning and shifting mechanism, comprising: a carrier platform on which a first item-sensing device is disposed; a transporting device on which a second item-sensing device is disposed; an overturning device which is positioned between the carrier platform and the transporting device and which comprises a driving device and a rotating arm connected with the driving device, the rotating arm being provided with a suction structure thereon; and a control device which is connected with the first item-sensing device, the second item-sensing device, the driving device and the suction structure; according to sensing signals of the first item-sensing device and the second item-sensing device, the control device controls the driving device to drive the rotating arm to reciprocatingly rotate between the carrier platform and the transporting device, while at the same time the control device controls sucking or releasing operation of the suction structure.

In one embodiment of the present disclosure, each of the first item-sensing device and the second item-sensing device is an optical fiber sensor; and the optical fiber sensor is connected with the control device in communication.

In one embodiment of the present disclosure, the carrier platform is provided with an item placement slot thereon, and the first item-sensing device is positioned at the bottom of the item placement slot; and the second item-sensing device is positioned at the bottom of the transporting device.

In one embodiment of the present disclosure, the transporting device can be configured such that it comprises a plurality of driven rollers which are in a juxtaposed arrangement and a plurality of driving rollers which are in a juxtaposed arrangement, the driving rollers having their rotary shafts connected to a driving motor, the driving motor being connected with the control device; a plurality of ring-like rubber strips which are spaced apart are disposed between the driven rollers and the driving rollers.

In the above transporting device, a receiving slot is provided in the driven rollers, and the receiving slot is provided to correspond to a gap between adjacent rubber strips; the receiving slot and the corresponding gap collectively form an initial receiving space of the rotating arm.

In one embodiment of the present disclosure, the driving device is a bidirectional motor, and the suction structure is disposed at a distal end of the rotating arm.

In one embodiment of the present disclosure, the suction structure is a vacuum suction disc, a suction block or a suction nozzle.

In one embodiment of the present disclosure, a circular driving gear is fixed to an output rotary shaft of the bidirectional motor by enclosing the latter, and an end of the rotating arm which is connected with the driving device is provided with a driven gear which is meshed with the circular driving gear.

In one embodiment of the present disclosure, an output rotary shaft of the bidirectional motor is connected with a lead screw and drives the lead screw to move reciprocatingly; and an end of the rotating arm which is connected with the driving device is provided with a driven gear which is meshed with the lead screw.

In one embodiment of the present disclosure, the driving device comprises two unidirectional motors having opposite rotating directions; an end of the rotating arm is provided with a driven shaft; and an output shaft of the unidirectional motor is connected with the driven shaft by a transmission belt.

In one embodiment of the present disclosure, the control device is a microcontrol unit or a programmable logic controller.

In the overturning and shifting mechanism provided by at least one embodiment of the present disclosure, a first item-sensing device is disposed on the carrier platform, and a second item-sensing device is disposed on the transporting device. The overturning device comprising a driving device and a rotating arm is positioned between the carrier platform and the transporting device and the rotating arm is provided with a suction structure thereon. The first item-sensing device, the second item-sensing device, the driving device and the suction structure are all connected with the control device. In the assembling process of a display panel, when no product is placed on the carrier platform and the transporting device, the control device controls the driving device to be idle upon the detection of the first and second item-sensing devices. When a non-final product is conveyed onto the carrier platform, the first item-sensing device generates a sensing signal. According to the sensing signal, the control device controls the driving device to operate so as to rotate and move the rotating arm to a position corresponding to the non-final product on the carrier platform. And then, the control device controls the suction structure to perform the sucking operation of the non-final product. The sucking action can ensure a uniform sucking force. After the suction is stabilized, the control device controls the driving device to drive the rotating arm to rotate so that the non-final product is overturned and shifted to the transporting device. When the non-final product is overturned and shifted to the transporting device, the second item-sensing device generates a sensing signal. According to the sensing signal, the control device controls to the suction structure to release, i.e., to stop the sucking operation of the non-final product, so that the non-final product is carried on the transporting device. It is convenient for transporting on the transporting device and performing subsequent assembly of films. Therefore, the overturning and shifting operation of non-final products can be automatically accomplished by the overturning and shifting mechanism of the present embodiment which is simple, convenient and time-saving and avoids contaminations caused by manual operations and a problem of deformation due to ununiform distribution of stress.

BRIEF DESCRIPTION OF THE DRAWINGS

In order to more clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
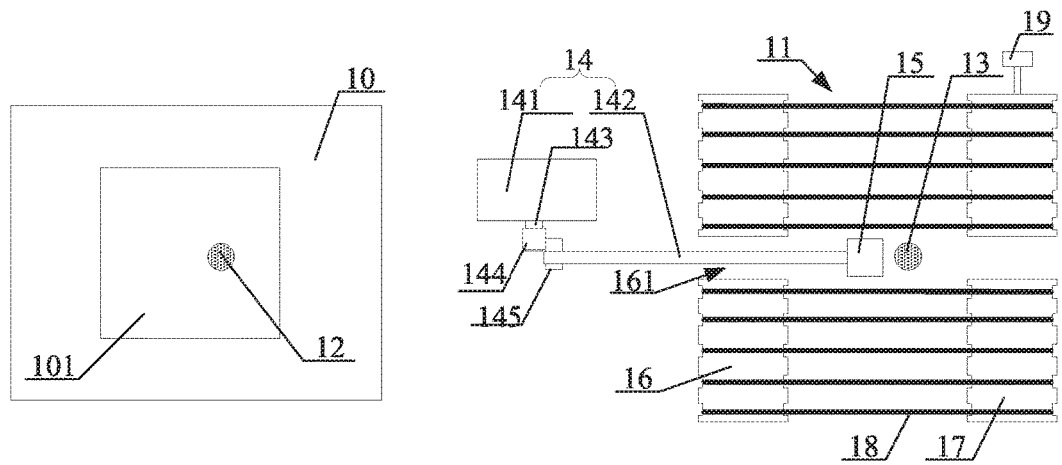
FIG. 1 is a structural view illustrating the overturning and shifting mechanism according to an embodiment of the present disclosure.

At least one embodiment of the present disclosure provides an overturning and shifting mechanism, as illustrated in FIG. 1, comprising a carrier platform 10 on which a first item-sensing device 12 is disposed; a transporting device 11 on which a second item-sensing device 13 is disposed; an overturning device 14 which is positioned between the carrier platform 10 and the transporting device 11 and which comprises a driving device 141 and a rotating arm 142 connected with the driving device 141, a suction structure 15 being disposed on the rotating arm 142; and a control device which is connected with the first item-sensing device 12, the second item-sensing device 13, the driving device 141 and the suction structure 15.

In one embodiment of the present disclosure, according to sensing signals of the first item-sensing device 12 and the second item-sensing device 13, the control device 15 controls the driving device 141 to drive the rotating arm 142 to reciprocatingly rotate between the carrier platform 10 and the transporting device 11, while at the same time it controls sucking or releasing operation of the suction structure 15.

In the overturning and shifting mechanism according to one embodiment of the present disclosure, a first item-sensing device is disposed on the carrier platform, and a second item-sensing device is disposed on the transporting device. The overturning device comprising a driving device and a rotating arm is positioned between the carrier platform and the transporting device and the rotating arm is provided with a suction structure thereon. The first item-sensing device, the second item-sensing device, the driving device and the suction structure are all connected with the control device. In the assembling process of a display panel, when no product is placed on the carrier platform and the transporting device, the control device controls the driving device to be idle upon the detection of the first item-sensing device and the second item-sensing device, i.e., perform no operation to the non-final product. When a non-final product is conveyed onto the carrier platform, the first item-sensing device generates a sensing signal. According to the sensing signal, the control device controls the driving device to operate so as to rotate and move the rotating arm to a position corresponding to the non-final product on the carrier platform. And then, the control device controls the suction structure to suck the non-final product, and controls the driving device to drive the rotating arm to rotate so that the non-final product is overturned and shifted to the transporting device from the carrier platform. When the non-final product is overturned and shifted to the transporting device, the second item-sensing device generates a sensing signal. According to the sensing signal, the control device controls to the suction structure to release, i.e., to stop the sucking operation of the non-final product, so that the non-final product is released to the transporting device. It is convenient for the non-final product to be transported on the transporting device and performing subsequent assembling of films. In the embodiment, the non-final product is sucked by a vacuum suction structure and the non-final product is stressed uniformly. The suction structure can firmly grasp the non-final product and move the non-final product to the transporting device. Therefore, the overturning and shifting operation of non-final products can be automatically accomplished by the overturning and shifting mechanism of the present embodiment which is simple, convenient and time-saving and prevents display panels from being contaminated and from being deformed.

The first item-sensing device 12 and the second item-sensing device 13 each can be an optical fiber sensor which has a high sensitivity and a fast transmission rate. To facilitate subsequent explanations on the operation principle of the overturning and shifting mechanism of the present embodiment, the sensing signal generated by the first item-sensing device 12 is defined as a first signal and the sensing signal generated by the second item-sensing device 13 is defined as a second signal. As the rotating arm 142 is to be reciprocatingly rotated between the carrier platform 10 and the transporting device 11, a position where the rotating arm 142 is located when the driving device 141 is not under control by the control device is defined as an initial position, a position where the rotating arm 142 is moved to the carrier platform and sucks a non-final product is defined as a sucking position, and a position where the rotating arm 142 sucking the non-final product is overturned and shifted to transporting device 11 is defined as a final position. Of course, an arrangement in which the initial position and the final position can be set to be an identical position simplifies the operation and is convenient for integral control.

When no product (non-final product) is placed on the carrier platform 10 and the transporting device 11, the first item-sensing device 12 and the second item-sensing device 13 generate no sensing signal, that is to say, neither the first signal nor the second signal is generated. At this time, the control device controls the driving device 141 to be idle and the rotating arm 142 is held in the initial position.

The first item-sensing device 12 corresponds to a normally on switch and the second item-sensing device 13 corresponds to a normally off switch. Respective signals are generated by changing of states of the normally on switch and the normally off switch. Specifically, the first signal is generated if the normally on switch is turned off, while the second signal is generated if the normally off switch is turned on. It can be also conceivable for those skilled in the art that a first item-sensing device 12 or a second item-sensing device 13 is within the protection scope of the present disclosure as long as it has a function of generating a signal when a non-final product is placed thereon.

When a non-final product is conveyed onto the carrier platform 10, the first signal is generated as the first item-sensing device 12 detects the placement of an item, while the second item-sensing device 13 generates no sensing signal. In this case, according to the first signal, the control device controls the driving device 141 to drive the rotating arm 142 so that the rotating arm 142 is moved from the initial position to the sucking position. After the rotating arm 142 is moved to the sucking position, the control device controls the driving device 141 to stop driving the rotating arm 142 so that the rotating arm 142 is held in the sucking position. And then, the control device controls the suction structure 15 to perform the sucking operation on the non-final product on the carrier platform 10. For example, the suction structure can be a vacuum suction disc (a conventional selection is a suction nozzle) or a suction block. Typically, depending on various dimensions of the non-final products, different types of suction structures are selected. For example, when a non-final product having a large dimension is to be sucked, the suction structure adopts a vacuum suction disc so as to enhance suction stability. Of course, the suction structure can also be other clamping structures which would not damage the non-final product.

Figure 2:
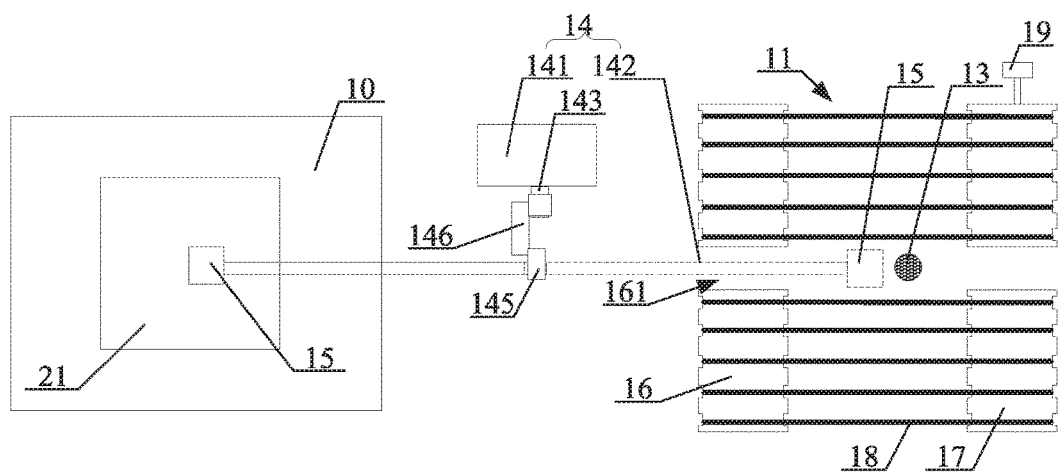
FIG. 2 is a structural view illustrating the overturning and shifting mechanism according to an embodiment of the present disclosure when being in operation.

To determine whether the suction structure 15 stably sucks the non-final product or not, a pressure sensor or the like which is connected with the control device can be provided. When the control device determines that the suction structure 15 stably sucks the non-final product, the control device controls the driving device 141 again so as to drive the rotating arm 142 and enable a rotary movement of the rotating arm 142, so that the rotating arm 142 is moved to the initial position from the sucking position. In the process, overturning and shifting of various products can be carried out by setting a relative position between the carrier platform 10 and the transporting device 11 and setting a rotary angle of the driving device 141 controlled by the control device (for example, an arrangement such as a bending configuration can be used in consideration of the structure of the rotating arm 142). As for the display panel, a final product of which has a thickness of about 1 mm, so it is usually necessary to horizontally overturn a non-final product by 180 degree so as to ensure good assembling of films to the non-final product. As illustrated in FIG. 1 and FIG. 2, the initial position and the sucking position of the rotating arm 142 are in the same plane and form an angle of 180 degree. The control device controls the driving device 141 to drive the rotating arm 142 to rotate, and when the rotating arm 142 is moved from the sucking position to the initial position, the non-final product is horizontally overturned by 180 degree and is transferred from back-assembling to front-assembling. At the same time, the non-final product is shifted from the carrier platform 10 onto the transporting device 11 by the rotating arm 142.

In one embodiment according to the present disclosure, the position of the rotating arm 142 illustrated in FIG. 1 is the initial position of the rotating arm 142, the position of the rotating arm 142 as denoted by a solid line in FIG. 2 is the sucking position of the rotating arm 142, and the position of the rotating arm 142 as denoted by a dotted line in FIG. 2 is the initial position of the rotating arm 142.

It is to be noted that FIG. 1 is an structural view illustrating the overturning and shifting mechanism wherein an item placement slot 101 is provided on the carrier platform 10 and no non-final product is placed on the carrier platform 10 and the transporting device 11. FIG. 2 illustratively shows that a non-final product 21 is placed on the carrier platform 10, wherein the non-final product 21 is placed in the item placement slot 101 and covers the first item-sensing device 12 which is positioned at the bottom of the item placement slot 101.

Figure 3:
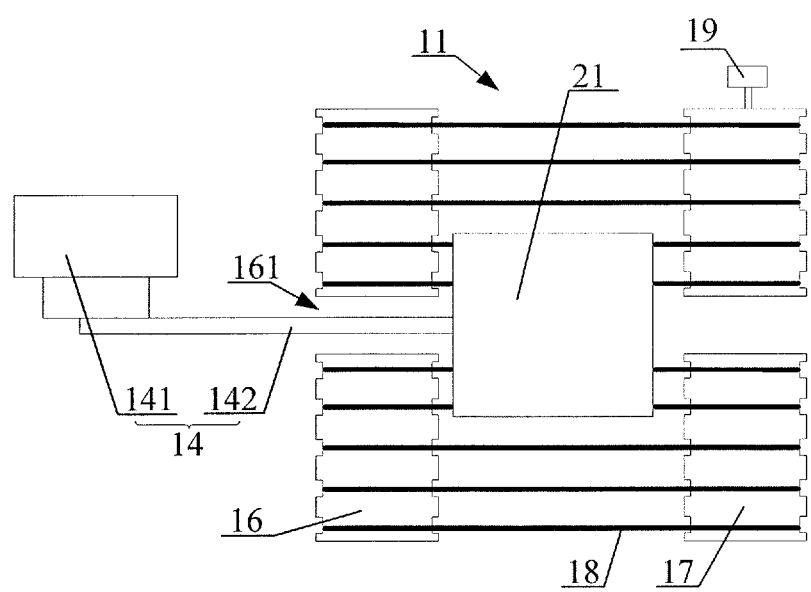
FIG. 3 is a partial structural view illustrating the overturning and shifting mechanism according to an embodiment of the present disclosure after being overturned and shifted.
Figure 4:
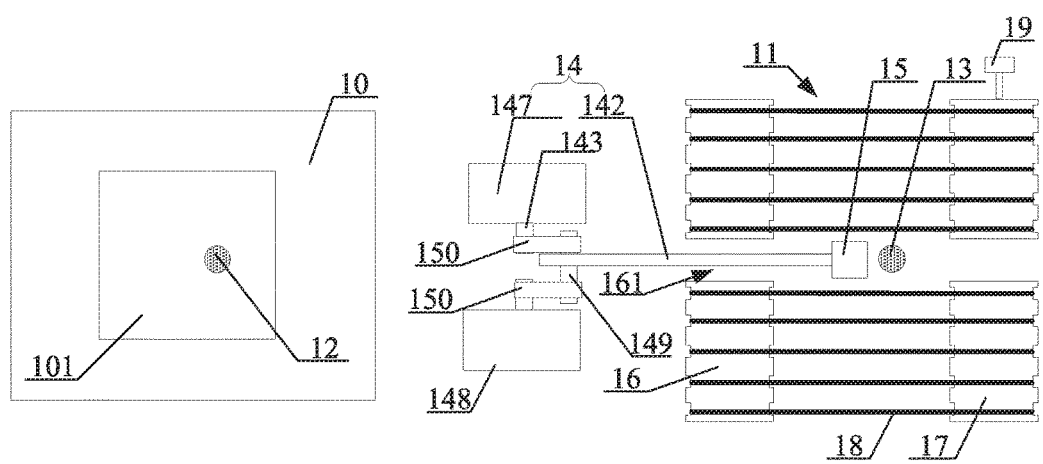
FIG. 4 is a structural view illustrating the overturning and shifting mechanism according to an embodiment of the present disclosure when being in operation.

Referring to FIG. 2 and FIG. 3, when the non-final product 21 is shifted onto the transporting device 11, the second item-sensing device 13 detects the presence of the non-final product 21 and generates the second signal. According to the second signal and/or according to a determination that the rotating arm 142 is moved to the initial position, the control device controls to stop the driving device 141 so that the rotating arm 142 is held in the initial position. And then, the control device controls the suction structure 15 to stop the sucking operation of the non-final product 21, so that the non-final product 21 is stably placed onto the transporting device 11, which is convenient for subsequent transporting and assembling of films.

The connection between the first item-sensing device 12 or the second item-sensing device 13 which are optical fiber sensors and the control device can be electrical connection or wireless connection. To facilitate detection of the non-final product 21 by the optical fiber sensors, as illustrated in FIG. 1, the item placement slot 101 can be provided on the carrier platform 10. Shapes and structures of the item placement slot 101 can be set according to the item to be placed. For example, when the item to be placed is a non-final product 21 of display panel, the item placement slot 101 can be a rectangular groove. In this case, the first item-sensing device 12 can be disposed at the bottom of the rectangular groove, so that when the non-final product 21 is conveyed in position, i.e., when the non-final product 21 is conveyed from the production line into the rectangular groove, the first item-sensing device 12 can rapidly and accurately detect the presence of item and generate the first signal and send it to the control device. Of course, the first item-sensing device can be disposed at other positions of the item placement slot 101 than the bottom.

Similarly, the second item-sensing device 13 can be disposed at the bottom of the transporting device 11, so that after the non-final product 21 is overturned and shifted onto the transporting device 11, the second item-sensing device 13 can rapidly and accurately detect the presence of item and generate the second signal and send it to the control device. Of course, the second item-sensing device can be disposed at other positions of the transporting device 11 rather than the bottom.

On practical occasions, the above control device can be a microcontroller unit or a programmable logic controller (PLC). The control device can be selected according to actual requirements.

It would be appreciated from the overturning and shifting operation process described above that the back-assembled non-final product 21 which is placed on the carrier platform 10 will be finally shifted onto the transporting device 11 by being horizontally overturned by 180 degree. In conventional technology, the transporting device 11 is usually a conveyor belt. Therefore, when the non-final product is overturned and shifted onto the conveyor belt by manual operations, the surface of the non-final product is in direct contact with the surface of the conveyor belt. Due to friction, the surface of the non-final product might be damaged and for example a light guiding plate might be damaged. In view of this, the transporting device in the embodiment of the present disclosure has a structure illustrated in FIG. 1 to FIG. 3, wherein the transporting device 11 comprises a plurality of driven rollers 16 which are in a juxtaposed arrangement and a plurality of driving rollers 17 which are in a juxtaposed arrangement. A first roller group composed by the driven rollers 16 and a second roller group composed by the driving rollers 17 are arranged in parallel with each other and in a coplanar manner, thereby ensuring that apexes of a plurality of ring-like rubber strips 18, which are arranged in parallel and spaced apart from each other and which connect the driven rollers 16 and the driving rollers 17 by housing them therein, are in the same horizontal plane. That is to say, it is ensured that the non-final product 21 positioned on the ring-like rubber strips 18 is horizontally placed. The rotating shaft of the driving rollers 17 is engaged with a driving motor 19. The rotation of the driving rollers 17 is controlled by the driving motor 19 so that the driven rollers 16 are driven to rotate in synchronism with the driving rollers 17 through transmission of the rubber strips 18, thereby ensuring stable transporting of the non-final product 21 on the transporting device 11.

FIG. 3 is an illustrative view after the non-final product 21 is overturned and shifted onto the rubber strips 18 of the transporting device 11 by the rotating arm 142. In FIG. 3, the rotating arm 142 and the suction structure 15 are located at the lower side of the non-final product 21, and thus the overturning of the non-final product 21 is accomplished, thereby ensuring that subsequent assembling can be performed in a front-assembling manner. At this time, the rotating arm 142 is positioned in the initial position.

In this case, the non-final product 21 is positioned on the surface of the plurality of rubber strips 18 after being overturned and shifted. Since there are gaps between the plurality of rubber strips 18, contact area between the non-final product 21 and the surface of the rubber strips 18 can be reduced, and thereby reducing friction and ensuring production quality of the non-final product 21 and the final product. In FIG. 1, the driven rollers 16 and the driving rollers 17 can have a plurality of rollers fixed on one main rotating shaft or can be roller groups formed by assembling of a plurality of individual rollers. The rubber strips 18 can be disposed on the rollers by directly housing the rollers therein. Alternatively, corresponding grooves can be processed on the rollers so that the rubber strips 18 can be mounted and housed in the grooves.

During overturning and shifting of the non-final product 21 of display panel, as it is usually necessary to have it horizontally overturned by 180 degree, in one embodiment, the rotating arm 142 is in a horizontal state when it is in the initial position and the sucking position, thereby ensuring that the non-final product 21 is in a horizontal state both before overturning and shifting and after overturning and shifting (the display panel has a very small thickness itself and thus an effect due to its thickness can be ignored). Therefore, as illustrated in FIG. 1 to FIG. 3, the driven rollers 16 are provided with a receiving slot 161 thereon. The receiving slot 161 is provided to correspond to the gap between the adjacent rubber strips 18, so that the receiving slot 161 and the gap corresponding thereto collectively form an initial receiving space of the rotating arm 142. That is to say, the initial position of the rotating arm 142 is positioned in the receiving slot 161 and its corresponding gap.

When the rotating arm 142 is in the initial position or drives the non-final product 21 to move to the initial position from the sucking position, by setting and adjusting configuration and position of the suction structure 15, it can be ensured that the rotating arm 142 being in the initial position will not hinder the transporting of the non-final product 21. For example, in one embodiment, when the rotating arm 142 carrying the non-final product 21 is rotated back to the initial position from the sucking position, the rotating arm 142 is located at the bottom of the non-final product 21, and the non-final product 21 is located on the rubber strips 18. When the control device controls the suction structure 15 to release the suction of the non-final product 21, the suction structure 15 and the non-final product 21 are no longer in contact with each other, thereby ensuring the transportation of the non-final product 21.

In the context, a process during which the rotating arm 142 is moved from the initial accommodation space (initial position) to the sucking position is defined as a positive overturning movement of the rotating arm 142. A process during which the rotating arm 142 is returned to the initial position from the sucking position is defined as a reverse overturning movement of the rotating arm 142. Correspondingly, the rotation of the driving device such as a motor which corresponds to the positive overturning movement of the rotating arm 142 is called a positive rotation, while the rotation which corresponds to the reverse overturning movement of the rotating arm 142 is called a reverse rotation.

The reciprocating rotary movement of the rotating arm 142 between the carrier platform 10 and the transporting device 11 is accomplished by cooperation of the driving device 141 and the rotating arm 142. In one embodiment, the driving device 141 can comprise a bidirectional motor. As illustrated in FIG. 1, a circular driving gear 144 is connected and fixed to the output rotary shaft 143 of the bidirectional motor 141 while an end of the rotating arm 142 which is connected with the bidirectional motor 141 can be provided with a circular driven gear 145 which is meshed with the circular driving gear 144. When the control device controls the bidirectional motor 141 to positively rotate or reversely rotate, the driven gear 145 is rotated by the driving gear 144 and thus the rotating arm 142 is driven to swing. Fixation of the rotating arm 142 and the bidirectional motor 141 can be achieved by means of a casing and the like.

Of course, the swinging operation of the rotating arm 142 can be achieved by a worm wheel structure. For example, as illustrated in FIG. 2, a lead screw 146 can be connected to the rotary shaft 143 of the bidirectional motor 141 and the connection between the bidirectional motor 141 and the lead screw 146 can be gear engagement or sliding engagement. Therefore, the reciprocating movement of the lead screw 146 can be achieved by positive rotation or reverse rotation of the bidirectional motor 141 under the control of the control device. When the lead screw 146 is reciprocated, the driven gear 145 which is meshed with the lead screw 146 can be rotated, i.e., the rotating arm 142 which is provided with the driven gear 145 is rotated. Similarly, fixation of the bidirectional motor 141 and fixation between the lead screw 146 and the bidirectional motor 141 can be achieved by means of providing a corresponding casing structure.

The above driving device 141 can be a bidirectional motor 141, i.e., a motor which can positively rotate and reversely rotate, so that it is convenient to control. However, for the sake of cost saving, the driving device 141 can comprise a unidirectional motor which is cheap in price. At the same time, to achieve rotations of the rotating arm 142 in different directions, as illustrated in FIG. 3, the driving device 141 comprises two unidirectional motors 147 and 148 having opposite rotating directions. One motor 147 or 148 is a positively rotating motor, and the other motor 148 or 147 is a reversely rotating motor. In this case, the rotating arm 142 is provided with a transmission shaft 149 protruding therefrom and fixed thereto, so that the output shaft 143 of the unidirectional motor 147 and 148 and the transmission shaft 149 are connected by a transmission belt 150 and thus a driving connection is completed. Similarly, fixation of the unidirectional motor, and fixation of the rotating arm and the swing path of the rotating arm and etc. can all be achieved by means of providing a corresponding casing structure.

In the description of the present disclosure, it is to be understood that the orientational or positional relationships denoted by terms of "central", "upper", "lower", "front", "back", "left", "right", "vertical", "horizontal", "top", "bottom", "inner", "outer" and etc. are on the basis of the orientational or positional relationships as illustrated in the drawings. It is only intended to facilitate the description of the present disclosure as well as to simplify the description, but not to indicate or suggest that the device or the element of interest has a specific orientation and is configured and operated in a specific orientation. It should not be construed as a limitation to the present disclosure.

Terms of "first" and "second" are for the purpose of illustration only and should not be understood as indicating or suggesting relative degree in importance or as a hint of the number or amounts of the technical features of interest. Therefore, a feature defined by "first" or "second" can directly or impliedly comprises one or more such feature(s). In the description of the present disclosure, unless otherwise stated, "a plurality of" means two or more than two.

It is to be noted that in the description of the present disclosure, unless otherwise stipulated or defined, terms of "mounting", "coupling" and "connecting" shall be understood in broad sense. For example, it can be fixed connection, or detachable connection or integral connection. It can be mechanical connection or electrical connection. It can be direct connection, or indirect connection via intermediate medium, or can be communication between internal portions of two elements. Those ordinary skilled in the art would understand the meaning of the above terms in the present disclosure in specific circumstances.

In the description of the present specification, the above features, structures, materials or characters can be combined in any one or several embodiment(s) or example(s) in a proper manner.

The foregoing are merely exemplary embodiments of the disclosure, but are not used to limit the protection scope of the disclosure. The protection scope of the disclosure shall be defined by the attached claims.

The present application claims priority of Chinese Patent Application No. 201510024325.8 filed on Jan. 16, 2015, the disclosure of which is hereby entirely incorporated by reference.

The invention claimed is:

1. An overturning and shifting mechanism, comprising:
a carrier platform on which a first item-sensing device is disposed;
a transporting device on which a second item-sensing device is disposed;
an overturning device which is positioned between the carrier platform and the transporting device and which comprises a driving device and a rotating arm connected with the driving device, the rotating arm being provided with a suction structure thereon; and
a control device which is connected with the first item-sensing device, the second item-sensing device, the driving device and the suction structure;
wherein according to sensing signals of the first item-sensing device and the second item-sensing device, the control device controls the driving device to drive the rotating arm to reciprocatingly rotate between the carrier platform and the transporting device, while at the same time the control device controls sucking or releasing operation of the suction structure;
wherein the transporting device comprises a plurality of driven rollers which are in a juxtaposed arrangement and a plurality of driving rollers which are in a juxtaposed arrangement, the driving rollers having their rotary shafts connected to a driving motor, the driving motor being connected with the control device; and
a plurality of ring-like rubber strips, which are arranged in parallel and spaced apart from each other, are connected between the driven rollers and the driving rollers by housing them therein; and
wherein a receiving slot is provided in the driven rollers, and the receiving slot is provided to correspond to a gap between adjacent rubber strips; and
the receiving slot and the corresponding gap collectively form an initial receiving space for the rotating arm.

2. The overturning and shifting mechanism according to claim 1, wherein each of the first item-sensing device and the second item-sensing device is an optical fiber sensor, and the optical fiber sensor is connected with the control device in communication.

3. The overturning and shifting mechanism according to claim 2, wherein the carrier platform is provided with an item placement slot thereon, and the first item-sensing device is positioned at the bottom of the item placement slot; the second item-sensing device is positioned at the bottom of the transporting device.

4. The overturning and shifting mechanism according to claim 2, wherein the suction structure is a vacuum suction disc, a suction block or a suction nozzle.

5. The overturning and shifting mechanism according to claim 2, wherein the driving device is a bidirectional motor, and the suction structure is disposed at a distal end of the rotating arm.

6. The overturning and shifting mechanism according to claim 1, wherein the carrier platform is provided with an item placement slot thereon, and the first item-sensing device is positioned at the bottom of the item placement slot; the second item-sensing device is positioned at the bottom of the transporting device.

7. The overturning and shifting mechanism according to claim 6, wherein the suction structure is a vacuum suction disc, a suction block or a suction nozzle.

8. The overturning and shifting mechanism according to claim 6, wherein the driving device is a bidirectional motor, and the suction structure is disposed at a distal end of the rotating arm.

9. The overturning and shifting mechanism according to claim 1, wherein the suction structure is a vacuum suction disc, a suction block or a suction nozzle.

10. The overturning and shifting mechanism according to claim 1, wherein the driving device is a bidirectional motor, and the suction structure is disposed at a distal end of the rotating arm.

11. The overturning and shifting mechanism according to claim 10, wherein a circular driving gear is fixed to an output rotary shaft of the bidirectional motor, and an end of the rotating arm which is connected with the driving device is provided with a driven gear which is meshed with the circular driving gear.

12. The overturning and shifting mechanism according to claim 10, wherein an output rotary shaft of the bidirectional motor is connected with a lead screw and drives the lead screw to move reciprocatingly; and an end of the rotating arm which is connected with the driving device is provided with a driven gear which is meshed with the lead screw.

13. The overturning and shifting mechanism according to claim 1, wherein the driving device comprises two unidirectional motors having opposite rotating directions; an end of the rotating arm is provided with a driven shaft; and an output shaft of each of the unidirectional motors is connected with the driven shaft by a transmission belt.

14. The overturning and shifting mechanism according to claim 1, wherein the control device is a microcontrol unit or a programmable logic controller.

* * * * *